United States Patent
He et al.

(10) Patent No.: US 8,400,336 B2
(45) Date of Patent: Mar. 19, 2013

(54) METHODS AND DEVICES FOR REORDERED PARALLEL ENTROPY CODING AND DECODING

(75) Inventors: Dake He, Waterloo (CA); Gaëlle Christine Martin-Cocher, Toronto (CA); Gergely Ferenc Korodi, Waterloo (CA)

(73) Assignee: Research In Motion Limited, Waterloo, Ontario (CA)

( * ) Notice: Subject to any disclaimer, the term of this patent is extended or adjusted under 35 U.S.C. 154(b) by 120 days.

(21) Appl. No.: 13/089,599

(22) Filed: Apr. 19, 2011

(65) Prior Publication Data

US 2011/0254712 A1 Oct. 20, 2011

Related U.S. Application Data

(60) Provisional application No. 61/325,806, filed on Apr. 19, 2010.

(51) Int. Cl.
*H03M 7/30* (2006.01)

(52) U.S. Cl. .......... 341/87; 704/203; 704/205; 704/500; 382/232; 375/240.25; 375/240.01; 375/E7.026; 375/E7.027; 341/78; 341/90

(58) Field of Classification Search ............ 341/50–90; 704/203, 205, 500, E19.017; 382/232; 375/240.25, 375/240.01, E7.026, E7.027

See application file for complete search history.

(56) References Cited

U.S. PATENT DOCUMENTS

| | | | | |
|---|---|---|---|---|
| 5,471,207 A | * | 11/1995 | Zandi et al. | 341/107 |
| 7,315,822 B2 | * | 1/2008 | Li | 704/500 |
| 7,395,210 B2 | * | 7/2008 | Li | 704/500 |
| 2012/0014457 A1 | * | 1/2012 | He et al. | 375/240.25 |

FOREIGN PATENT DOCUMENTS

| | | |
|---|---|---|
| GB | 2319689 | 5/1998 |
| JP | 8065171 | 3/1996 |

OTHER PUBLICATIONS

Dake et al., Improving throughput for V2V coding in HEVC, Input Document by Research in Motion Ltd. to Joint Collaborative Team on Video Coding (JCT-VC), Geneva, Jul. 21-28, 2010.

Budagavi et al., Parallel Context Processing techniques for high coding efficiency entropy coding in HEVC, Input Document by Texas Instrucments Inc to Joint Collaborative Team on Video Coding (JCT-VC), Geneva, Jul. 21-28, 2010.

International Search Report dated Jul. 8, 2011, PCT/CA2011/050208.

* cited by examiner

*Primary Examiner* — Lam T Mai
(74) *Attorney, Agent, or Firm* — Rowand LLP

(57) ABSTRACT

A method for parallel context modeling through reordering the bits of an input sequence to form groups of bits in accordance with a context model-specific reordering schedule. The reordering schedule is developed such that the groups of bits are formed to satisfy two conditions: first, that the context for each of the bits in a group of bits is different from the context of each of the other bits in that group, and the context of each of the bits in that group is determined independently from each of the other bits in that group. The parallel context modeling may be used in encoding or decoding operations.

18 Claims, 11 Drawing Sheets

METHODS AND DEVICES FOR REORDERED PARALLEL ENTROPY CODING AND DECODING

CROSS-REFERENCE TO RELATED APPLICATIONS

The present application claims priority to U.S. provisional application Ser. No. 61/325,806 filed Apr. 19, 2010, and owned in common herewith.

FIELD

The present application generally relates to data compression and, in particular, to an encoder, a decoder and methods of entropy coding finite alphabet sources.

BACKGROUND

Data compression, whether lossy or lossless, often uses entropy coding to encode a decorrelated signal as a sequence of bits, i.e. a bitstream. Efficient data compression has a wide range of applications, such as image, audio, and video encoding. The current state-of-the-art for video encoding is the ITU-T H.264/MPEG AVC video coding standard. It defines a number of different profiles for different applications, including the Main profile, Baseline profile and others.

There are a number of standards and industry formats for encoding/decoding images and videos, including H.264, which employ lossy compression processes to produce binary data. For example, H.264 includes a prediction operation to obtain residual data, followed by a DCT transform and quantization of the DCT coefficients. The resulting data, including quantized coefficients, motion vectors, coding mode, and other related data, is then entropy coded to generate a bitstream of data for transmission or storage on a computer-readable medium.

A number of coding schemes have been developed to encode binary data. For example, JPEG images may be encoded using Huffman codes. The H.264 standard allows for two possible entropy coding processes: Context Adaptive Variable Length Coding (CAVLC) or Context Adaptive Binary Arithmetic Coding (CABAC). CABAC results in greater compression than CAVLC, but CABAC is more computationally demanding. Some industry formats include a context adaptive arithmetic entropy coding scheme. Other standards can be the HEVC, SVC, 3DV standards. In any of these cases, the coding scheme operates upon the binary data to produce a serial bitstream of encoded data. At the decoder, the decoding scheme receives the bitstream and entropy decodes the serial bitstream to reconstruct the binary data.

It would be advantageous to provide for an improved encoder, decoder and method of entropy coding.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

Figure 1:
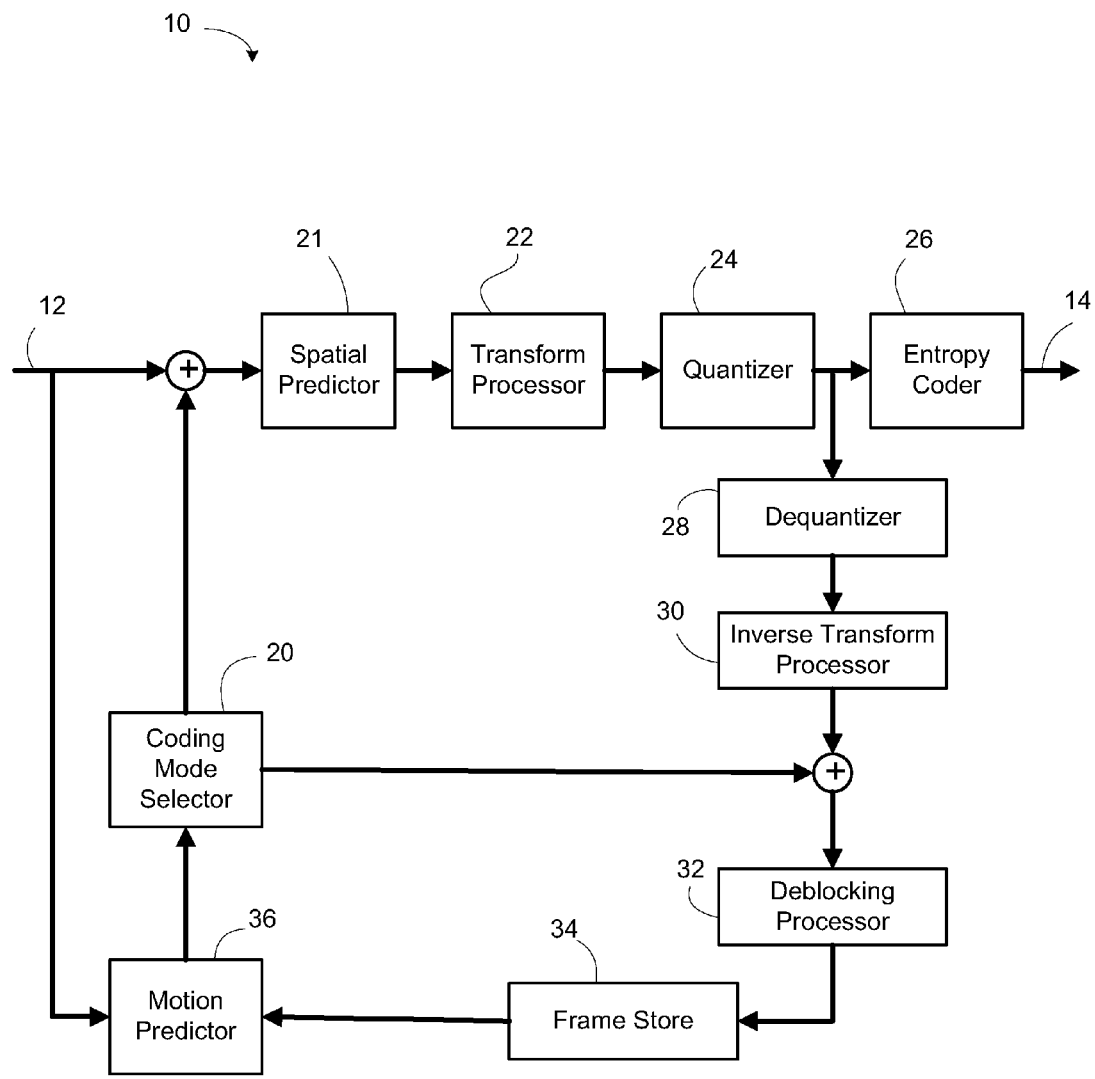
FIG. 1 shows, in block diagram form, an encoder for encoding video.

In one aspect, the present application describes a method for encoding of an input sequence of bits. The method includes reordering the input sequence into groups of input bits in accordance with a predetermined reordering schedule; for each group of input bits, determining, in parallel, a context for each of the input bits in the group of input bits and associating a probability with that bit based on its context, wherein the context for each of the input bits in the group is different from the context of each of the other input bits in the group, and the context of each of the input bits in the group is determined independently from the other input bits in the group; and entropy encoding the input bits to generate an encoded subsequence.

In another aspect, the present application describes an encoder for encoding an input sequence of symbols. The encoder includes a processor; memory; and an encoding application stored in memory and containing instructions for configuring the processor to encode the input sequence in accordance with the method described above.

In yet a further aspect, the present application describes a method for decoding method for decoding a bitstream of encoded data to reconstruct a sequence of bits. The method includes decoding the bitstream of encoded data to produce decoded groups of bits, wherein, for each group of bits, the decoding to produce that group of bits includes determining a context for each bit in that group of bits and associating a probability with that bit based on its context, and wherein the context for each of the bits in that group of bits is different from the context of each of the other bits in that group, and the context of each of the bits in that group is determined independently from each of the other bits in that group; and reordering the bits of the groups of bits based on a predetermined reordering schedule to produce the reconstructed sequence of bits.

In yet a further aspect, the present application describes a decoder for decoding encoded data for decoding a bitstream of encoded data to reconstruct a sequence of symbols. The decoder includes a processor; memory; and a decoding application stored in memory and containing instructions for configuring the processor to decode the bitstream in accordance with the method described above.

In another aspect, the present application describes a computer-readable medium containing computer-executable instruction that, when executed, configure a processor to perform one or more methods described herein.

Other aspects and features of the present application will be understood by those of ordinary skill in the art from a review of the following description of examples in conjunction with the accompanying figures.

The following description relates to data compression in general and, in particular, to the efficient parallel encoding of finite alphabet sources, such as a binary source. In many of the examples given below, particular applications of such an encoding and decoding scheme are given. For example, many of the illustrations below make reference to video coding. It will be appreciated that the present application is not limited to video coding or image coding.

In the description that follows, example embodiments are described with reference to the H.264 standard. Those ordinarily skilled in the art will understand that the present application is not limited to H.264 but may be applicable to other video coding/decoding standards. It will also be appreciated that the present application is not necessarily limited to video coding/decoding and may be applicable to coding/decoding of any binary sources.

In the description that follows, in the context of video applications the terms frame and slice are used somewhat interchangeably. Those of skill in the art will appreciate that, in the case of the H.264 standard, a frame may contain one or more slices. It will also be appreciated that certain encoding/decoding operations are performed on a frame-by-frame basis and some are performed on a slice-by-slice basis, depending on the particular requirements of the applicable video coding standard. In any particular embodiment, the applicable video coding standard may determine whether the operations described below are performed in connection with frames and/or slices, as the case may be. Accordingly, those ordinarily skilled in the art will understand, in light of the present disclosure, whether particular operations or processes described herein and particular references to frames, slices, or both are applicable to frames, slices, or both for a given embodiment.

Figure 2:
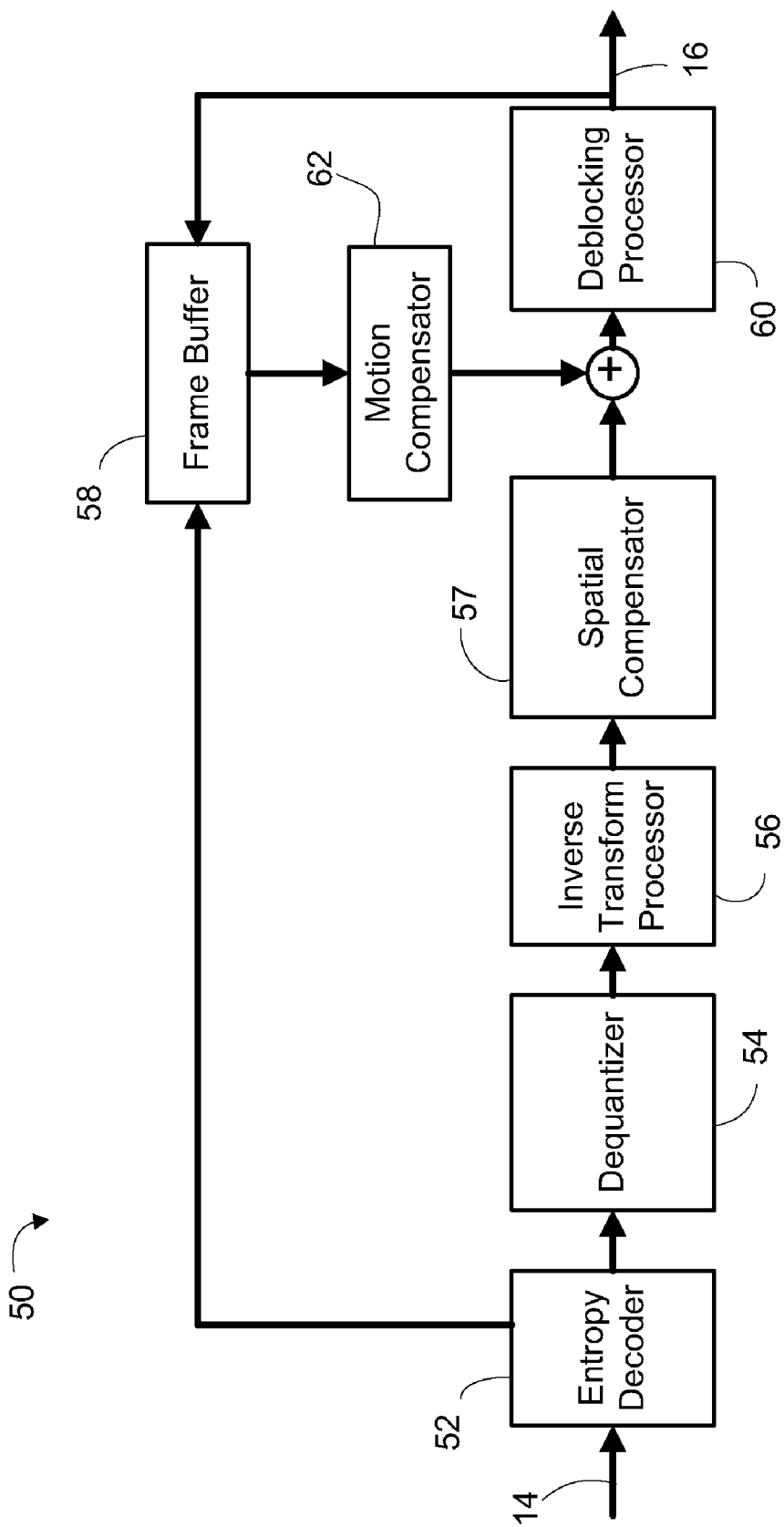
FIG. 2 shows, in block diagram form, a decoder for decoding video.

Reference is now made to FIG. 1, which shows, in block diagram form, an encoder 10 for encoding video. Reference is also made to FIG. 2, which shows a block diagram of a decoder 50 for decoding video. It will be appreciated that the encoder 10 and decoder 50 described herein may each be implemented on an application-specific or general purpose computing device, containing one or more processing elements and memory. The operations performed by the encoder 10 or decoder 50, as the case may be, may be implemented by way of application-specific integrated circuit, for example, or by way of stored program instructions executable by a general purpose processor. The device may include additional software, including, for example, an operating system for controlling basic device functions. The range of devices and platforms within which the encoder 10 or decoder 50 may be implemented will be appreciated by those ordinarily skilled in the art having regard to the following description.

The encoder 10 receives a video source 12 and produces an encoded bitstream 14. The decoder 50 receives the encoded bitstream 14 and outputs a decoded video frame 16. The encoder 10 and decoder 50 may be configured to operate in conformance with a number of video compression standards. For example, the encoder 10 and decoder 50 may be H.264/AVC compliant. In other embodiments, the encoder 10 and decoder 50 may conform to other video compression standards, including evolutions of the H.264/AVC standard.

The encoder 10 includes a spatial predictor 21, a coding mode selector 20, transform processor 22, quantizer 24, and entropy coder 26. As will be appreciated by those ordinarily skilled in the art, the coding mode selector 20 determines the appropriate coding mode for the video source, for example whether the subject frame/slice is of I, P, or B type, and whether particular macroblocks within the frame/slice are inter or intra coded. The transform processor 22 performs a transform upon the spatial domain data. In particular, the transform processor 22 applies a block-based transform to convert spatial domain data to spectral components. For example, in many embodiments a discrete cosine transform (DCT) is used. Other transforms, such as a discrete sine transform or others may be used in some instances. Applying the block-based transform to a block of pixel data results in a set of transform domain coefficients. The set of transform domain coefficients is quantized by the quantizer 24. The quantized coefficients and associated information, such as motion vectors, quantization parameters, etc., are then encoded by the entropy coder 26.

Intra-coded frames/slices (i.e. type I) are encoded without reference to other frames/slices. In other words, they do not employ temporal prediction. However intra-coded frames do rely upon spatial prediction within the frame/slice, as illustrated in FIG. 1 by the spatial predictor 21. That is, when encoding a particular block the data in the block may be compared to the data of nearby pixels within blocks already encoded for that frame/slice. Using a prediction algorithm, the source data of the block may be converted to residual data. The transform processor 22 then encodes the residual data. H.264, for example, prescribes nine spatial prediction modes for 4×4 transform blocks. In some embodiments, each of the nine modes may be used to independently process a block, and then rate-distortion optimization is used to select the best mode.

The H.264 standard also prescribes the use of motion prediction/compensation to take advantage of temporal prediction. Accordingly, the encoder 10 has a feedback loop that includes a de-quantizer 28, inverse transform processor 30, and deblocking processor 32. These elements mirror the decoding process implemented by the decoder 50 to reproduce the frame/slice. A frame store 34 is used to store the reproduced frames. In this manner, the motion prediction is based on what will be the reconstructed frames at the decoder 50 and not on the original frames, which may differ from the reconstructed frames due to the lossy compression involved in encoding/decoding. A motion predictor 36 uses the frames/slices stored in the frame store 34 as source frames/slices for comparison to a current frame for the purpose of identifying similar blocks. Accordingly, for macroblocks to which motion prediction is applied, the "source data" which the transform processor 22 encodes is the residual data that comes out of the motion prediction process. The residual data is pixel data that represents the differences (if any) between the reference block and the current block. Information regarding the reference frame and/or motion vector may not be processed by the transform processor 22 and/or quantizer 24, but instead may be supplied to the entropy coder 26 for encoding as part of the bitstream along with the quantized coefficients.

Those ordinarily skilled in the art will appreciate the details and possible variations for implementing H.264 encoders.

The decoder 50 includes an entropy decoder 52, dequantizer 54, inverse transform processor 56, spatial compensator 57, and deblocking processor 60. A frame buffer 58 supplies reconstructed frames for use by a motion compensator 62 in applying motion compensation. The spatial compensator 57 represents the operation of recovering the video data for a particular intra-coded block from a previously decoded block.

The bitstream 14 is received and decoded by the entropy decoder 52 to recover the quantized coefficients. Side information may also be recovered during the entropy decoding process, some of which may be supplied to the motion compensation loop for use in motion compensation, if applicable. For example, the entropy decoder 52 may recover motion vectors and/or reference frame information for inter-coded macroblocks.

The quantized coefficients are then dequantized by the dequantizer 54 to produce the transform domain coefficients, which are then subjected to an inverse transform by the inverse transform processor 56 to recreate the "video data". It will be appreciated that, in some cases, such as with an intra-coded macroblock, the recreated "video data" is the residual data for use in spatial compensation relative to a previously decoded block within the frame. The spatial compensator 57 generates the video data from the residual data and pixel data from a previously decoded block. In other cases, such as inter-coded macroblocks, the recreated "video data" from the inverse transform processor 56 is the residual data for use in motion compensation relative to a reference block from a different frame. Both spatial and motion compensation may be referred to herein as "prediction operations".

The motion compensator 62 locates a reference block within the frame buffer 58 specified for a particular inter-coded macroblock. It does so based on the reference frame information and motion vector specified for the inter-coded macroblock. It then supplies the reference block pixel data for combination with the residual data to arrive at the recreated video data for that macroblock.

A deblocking process may then be applied to a reconstructed frame/slice, as indicated by the deblocking processor 60. After deblocking, the frame/slice is output as the decoded video frame 16, for example for display on a display device. It will be understood that the video playback machine, such as a computer, set-top box, DVD or Blu-Ray player, and/or mobile handheld device, may buffer decoded frames in a memory prior to display on an output device.

Entropy coding is a fundamental part of all lossless and lossy compression schemes, including the video compression described above. The purpose of entropy coding is to represent a presumably decorrelated signal, often modeled by an independent, but not identically distributed process, as a sequence of bits. The technique used to achieve this must not depend on how the decorrelated signal was generated, but may rely upon relevant probability estimations for each upcoming symbol.

There are two common approaches for entropy coding used in practice: the first one is variable-length coding, which identifies input symbols or input sequences by codewords, and the second one is range (or arithmetic) coding, which encapsulates a sequence of subintervals of the [0, 1) interval, to arrive at a single interval, from which the original sequence can be reconstructed using the probability distributions that defined those intervals. Typically, range coding methods tend to offer better compression, while VLC methods have the potential to be faster. In either case, the symbols of the input sequence are from a finite alphabet.

A special case of entropy coding is when the input alphabet is restricted to binary symbols. Here VLC schemes must group input symbols together to have any potential for compression, but since the probability distribution can change after each bit, efficient code construction is difficult. Accordingly, range encoding is considered to have greater compression due to its greater flexibility, but practical applications are hindered by the higher computational requirements of arithmetic codes.

A common challenge for both of these encoding approaches is that they are inherently serial in nature. In some important practical applications, such as high-quality video decoding, the entropy decoder has to reach very high output speed, which can pose a problem for devices with limited processing power or speed.

One of the techniques used in some entropy coding schemes, such as CAVLC and CABAC, both of which are used in H.264/AVC, is context modeling. This technique can be used in other context adaptive entropy coding schemes. With context modeling, each bit of the input sequence has a context, where the context is given by the bits that preceded it or side information available to both the encoder and the decoder. In a first-order context model, the context may depend entirely upon the previous bit (symbol). In many cases, the context models may be adaptive, such that the probabilities associated with symbols for a given context may change as further bits of the sequence are processed.

Figure 3:
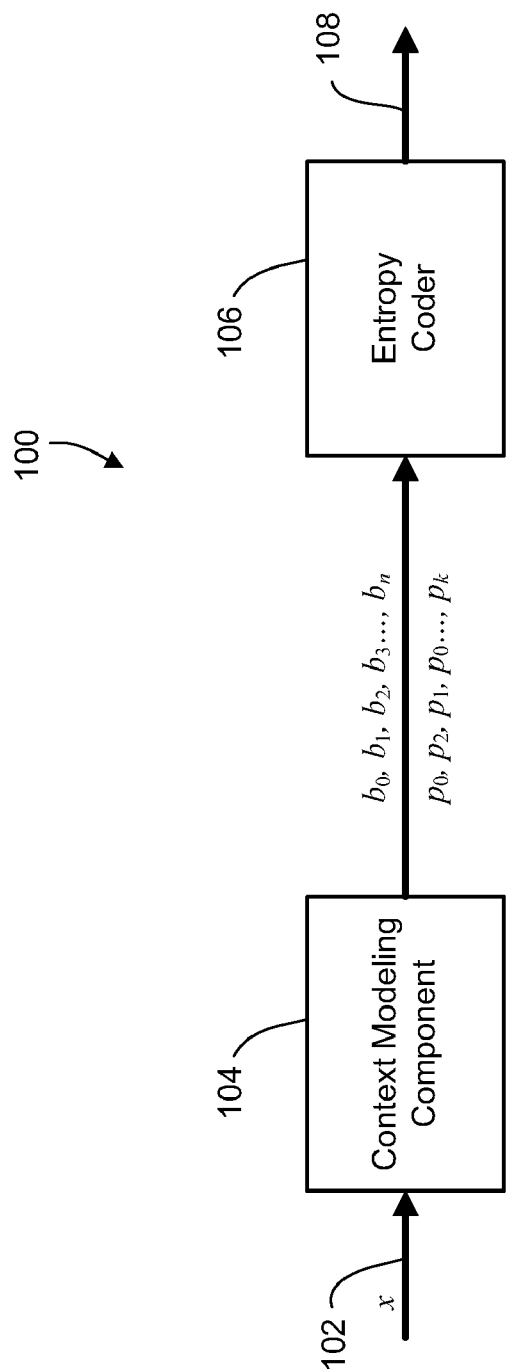
FIG. 3 shows a block diagram of an encoding process.

Reference is made to FIG. 3, which shows a block diagram of an encoding process 100. The encoding process 100 includes a context modeling component 104 and an entropy coder 108. The context modeling component 104 receives the input sequence x 102, which in this example is a bit sequence ($b_0, b_1, \ldots, b_n$). The context modeling component 104 determines a context for each bit $b_i$ based on one or more previous bits in the sequence, and determines, based on the adaptive context model, a probability $p_i$ associated with that bit $b_i$, where the probability is the probability that the bit will be the Least Probable Symbol (LPS). The LPS may be "0" or "1" in a binary embodiment, depending on the convention or application. The context modeling component outputs the input sequence, i.e. the bits ($b_0, b_1, \ldots, b_n$) along with their respective probabilities ($p_0, p_1, \ldots, p_n$). The probabilities are an estimated probability determined by the context model. This data is then input to the entropy coder 106, which encodes the input sequence using the probability information. For example, the entropy coder 106 may be a binary arithmetic coder. The entropy coder 106 outputs a bitstream 108 of encoded data.

It will be appreciated each bit of the input sequence is processed serially to update the context model, and the serial bits and probability information are supplied to the entropy coder 106, which then serially entropy codes the bits to create the bitstream 108.

Those ordinarily skilled in the art will appreciate that, in some embodiments, explicit probability information may not be passed from the context modeling component 104 to the entropy coder 106; rather, in some instances, for each bit the context modeling component 104 may send the entropy coder 106 an index or other indicator that reflects the probability estimation made be the context modeling component 104 based on the context model and the current context of the input sequence 102. The index or other indicator is indicative of the probability estimate associated with its corresponding bit.

In accordance with one aspect, the present application proposes an encoder and decoder having a parallel processing architecture for entropy coding and decoding. The architecture includes a context modeling component which, for each bit of the input sequence, determines an estimated probability based on the context model. The context modeling component assigns each bit to one of N "sources" based on its estimated probability. In this manner, each of the N sources builds up a subsequence of bits assigned to it. Each of the N subsequences is then entropy coded by its own entropy encoder in parallel to generate a bitstream. The N bitstreams are then combined to form a single bitstream. Indexing data is added to the single bitstream to enable the decoder to demultiplex the single bitstream into the N bitstreams.

At the decoder, the signal bitstream is demultiplexed to obtain the N bitstreams, which are then entropy decoded in parallel to recover the N subsequences. The bits of the N subsequences are then interleaved in accordance with the context model to reconstruct the input sequence.

Figure 4:
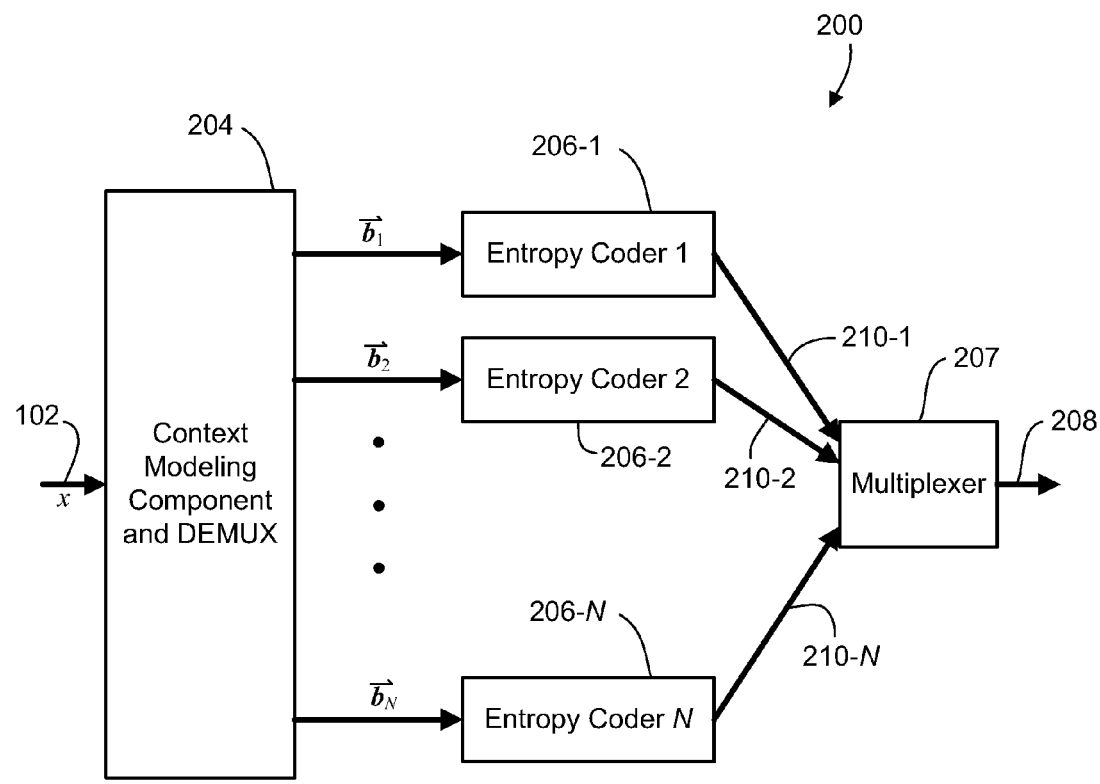
FIG. 4 shows, in block diagram form, an example encoder in accordance with an aspect of the present application.

Reference is now made to FIG. 4, which shows, in block diagram form, an example encoder 200. The encoder 200 receives an input sequence x 102, which in this example is a binary sequence. The encoder 200 outputs a bitstream 208 of encoded data.

The encoder 200 includes a context modeling component and demultiplexer 204. The context modeling component and demultiplexer 204 generate N subsequences $(b_1, b_2, \ldots, b_N)$ using a context model. In particular, for each bit of the input sequence x 102, its context is determined using the context model and, based on its context, an estimated probability is determined and associated with the bit. Each bit is then assigned to one of the N subsequences based on its associated estimated probability. In one example embodiment, there are N probabilities $p_i$ (i=0, 1, ..., N−1) defined by the context model and N subsequences; however, in some example embodiments there may be fewer subsequences than probabilities, meaning that bits associated with some probabilities may be assigned to the same subsequence. In some embodiments, there may be more subsequences that probabilities, meaning that some bits having the same associated probability may be split among two or more subsequences.

The N subsequences may be considered separate "sources". Accordingly, the terms "source" and "subsequence" may be used interchangeably herein. To the extent that the present application refers to a bit being "assigned" or "allocated" to a source, it indicates that the bit has been added to or appended to a subsequence associated with a particular probability estimation.

The context model may be static or may be adaptive. It will be understood that in the case of some sequences, in particular a binary sequence, an adaptive context model is likely to result in better performance than a static model.

The encoder 200 includes N parallel entropy coders 206 (individually labeled as 206-1, 206-2, ..., 206-N). Each entropy coder 206 encodes one of the subsequences to produce an encoded subsequence bitstream 210 (individually labeled as 210-1, 210-2, ..., 210-N). The encoded subsequence bitstreams 210 are then combined into a single bitstream 208 using, for example, a multiplexer 207. In this example, the encoded subsequence bitstreams 210 are multiplexed together to create the bitstream 208 by concatenating the subsequence bitstreams 210 and adding indexing information to the bitstream 208 to enable the decoder to identify the start of each encoded subsequence bitstream 210 in the single bitstream 208.

The entropy coders 206 may use any arbitrary entropy coding scheme for encoding the subsequences. In one example, the entropy coders may be order-0 lossless encoders. In a further example, the entropy coders 206 may employ a binary arithmetic coding scheme. In another example, the entropy coders 206 may employ a static k-bit Huffman code scheme. Yet other possibilities will be understood by those skilled in the art.

In yet further example embodiments, the entropy coders 206 may not all employ the same coding scheme. For example, one of the entropy coders 206 may use a static Huffman code, while another entropy coder 206 may use a binary arithmetic coding scheme. The entropy coders 206 are independent in this sense. In some instances, it might be desirable to encode certain subsequences associated with particular probabilities with one coding scheme, while encoding other subsequences associated with different probabilities with a different coding scheme.

Figure 5:
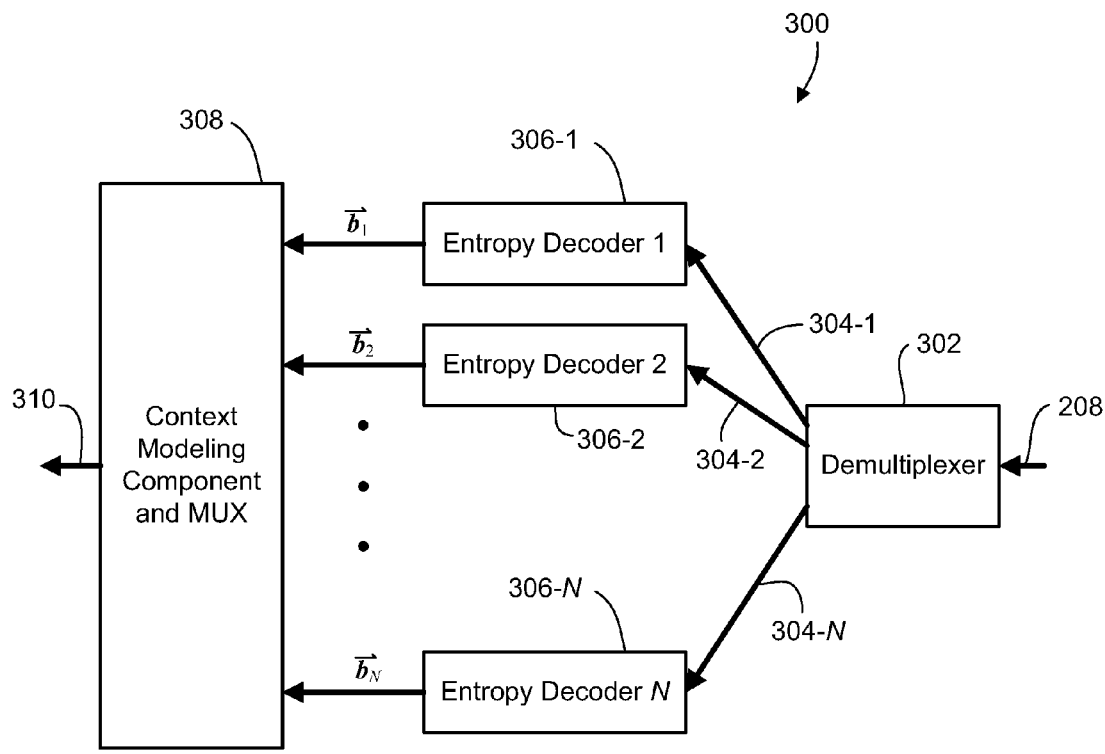
FIG. 5 shows, in block diagram form, an example decoder in accordance with an aspect of the present application.

Reference is now made to FIG. 5, which shows, in block diagram form, an example decoder 300. The decoder 300 receives the single bitstream 208 of encoded data and outputs a reconstructed sequence 310.

The decoder 300 includes a demultiplexer 302 for parsing the bitstream 208 extracting encoded subsequence bitstreams 304 (individually labeled as 304-1, 304-2, ..., 304-N). In an embodiment in which the bitstream 208 is formatted to include all the subsequence bitstreams 304 concatenated, then indexing within the bitstream 208 may be used by the demultiplexer 302 to identify the beginning and end locations of the subsequence bitstreams 304.

The decoder 300 further includes N entropy decoders 306 (individually labeled 306-1, 306-2, ..., 306-N). Each entropy decoder 306 receives one of the encoded subsequence bitstreams 304, and entropy decodes the encoded subsequence bitstream 304 to output the subsequence bitstream $b_i$, i=1, 2, ..., N. The N subsequence bitstreams from the N entropy decoders 306 are input to a context modeling component and multiplexer 308. The context modeling component and multiplexer 308 interleaves the symbols (bits) of the N subsequence bitstreams to generate the reconstructed sequence 310. The interleaving is based on a context model (the same context model used by the encoder 200), and using the context model to determine the estimated probability for a given context. Based on the estimated probability, the context modeling component and multiplexer 308 is able to identify which subsequence from which to select the next bit to add to the reconstructed sequence 310. On this basis, the reconstructed sequence 310 is created, matching the input sequence x 102.

Figure 6:
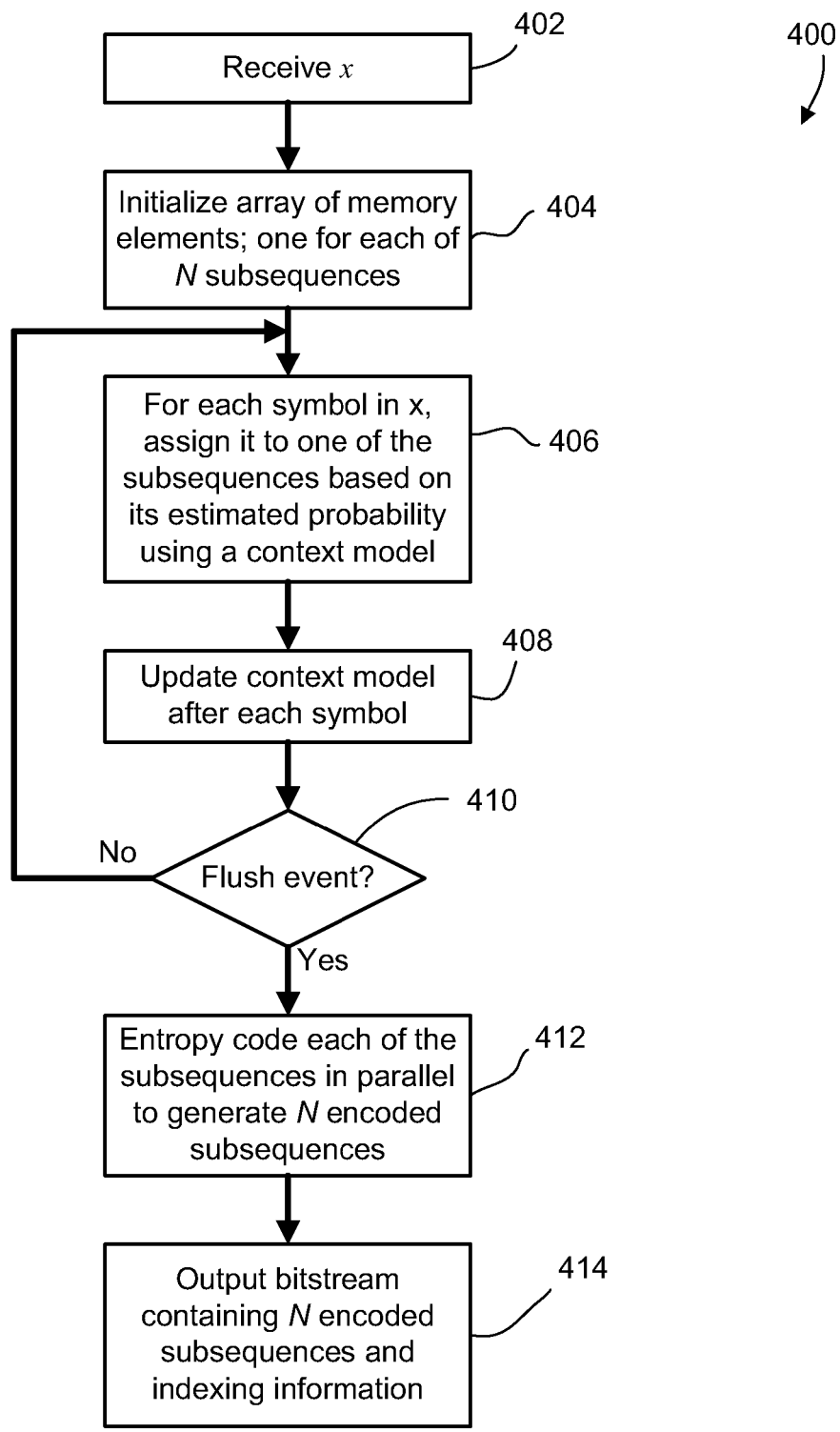
FIG. 6 shows, in flowchart form, an example method of encoding an input sequence of symbols using parallel entropy coders.

Reference is now made to FIG. 6, which shows, in flowchart form, an example method 400 of entropy encoding an input sequence x. The method 400 begins in step 402 with receipt of the input sequence x. The input sequence x is a binary sequence B=b1, b2, ... of binary symbols with probability estimates Pi(bi=0) and Pi(bi=1)=1−Pi(0). The probability estimates for the Least Probable Symbol (LPS) form a finite set:

$$S=\{Pk | 1 \leq k \leq N, 0 < Pk \leq 0.5\}$$

The input sequence x may be considered as N sources outputting binary symbols using their respective probabilities in an arbitrary order.

In the example method 400, an array is initialized with N elements. The array may be an allocation of memory or registers having an element for each of the N sources, i.e. an element for collecting bits to build each of the N subsequences. In one embodiment each element may include two fields: a first field collecting symbols associated with its source, and a second field containing a pointer to the next element for the same source. When the first field is filled with bits, another element is added to the array for that source. In one embodiment, the first field is a 32-bit register for collecting symbols associated with the source.

Step 406 of the method 400 illustrates the context modeling and demuliplexing operation. In step 406, for each symbol (bit) of input sequence x, its context is determined, for example based on one or more previous bits in the input sequence x, and an estimated probability for the bit is determined based on its context and the context model. The bit is then assigned to one of the N sources based on its estimated probability. In other words, the bit is saved in the element corresponding to the source/subsequence associated with the estimated probability.

In step 408, after each symbol is processed in step 406 the context model may be updated, if the context model is adaptive.

Steps 406 and 408 repeat on a bit-by-bit basis to serially process the input sequence x, allocating its bits amongst the N subsequences based on their estimated probabilities. In step 410, if a flush event is detected, then the cycling of steps 406 and 408 end. A flush event may be any trigger event suitable to the application. For example, in video encoding, the flush event may be an end-of-frame, or end-of-slice. In image processing, the flush event may be an end-of-image. In one embodiment, the flush event may even be an end-of-macroblock. The flush event may also be based on a threshold or criteria being met by one or more of the subsequences. For example, if at least one subsequence exceeds the threshold number of symbols a flush event may occur. Other possible flush events will be appreciated by those ordinarily skilled in the art.

On occurrence of the flush event in step 410, the subsequences are supplied to their respective entropy coders where they are each entropy coded to produce respective encoded subsequences, as indicated in step 412. In one example embodiment, the entropy coders are configured to use static 8-bit Huffman coding to encode the subsequences. Other coding schemes, including binary arithmetic coding, may alternatively be used. A combination of coding schemes may also be used, for instance using a different coding scheme per subsequence. It will be appreciated that the entropy coding of the subsequences in step 412 occurs in parallel due to the parallel architecture of the entropy coders.

In step 414, a single bistream is constructed by multiplexing the N encoded subsequences. In this embodiment, the single bitstream is constructed by concatenating the encoded bitstreams in a payload portion of the bitstream in known order, and providing the bitstream with a prefix field containing indexing information for identifying the location of each of the encoded subsequences in the bitstream.

It will be appreciated that the steps 406, 408, 410, 412, and 414 may be repeated for multiple frames or slices in the case of encoding of a video, so as to generate a bitstream encoding multiple frames.

It will be appreciated that the encoded subsequences may be of different lengths when the flush event occurs. Accordingly, indexing information in the prefix field may be provided to pinpoint the location of each encoded subsequence in the payload portion of the bitstream. In some embodiments, the lengths may be encoded and placed in the prefix field. For example, the length of each encoded subsequence k in bytes may be given by $L(k)$. The prefix code may be defined as:

If $n<128$, then $C(n)=n<<1$;

Else if $n<16512$, then $C(n)=((n-128)<<2)|1$;

Else if $n<2113664$, then $C(n)=((n-16512)<<3)|3$;

Else $C(n)=((n-2113664)<<3)|7$;

where "$<<$" is a right shift, and "$|$" is a bit-wise OR.

It will be appreciated that there may be an upper limit on "n", which in this case is $L(k)$. The upper limit in any given embodiment may be dependent upon the implementation. The upper limit may be set by the maximum number of bytes that may be used for a given subsequence, or by the maximum number of bytes that can be used for specifying the length of the subsequence. In one instance, the limit on $L(k)$ is that it must be represented within four bytes, meaning the size of $L(k)$ is limited by about $2^{16}+2113664$.

Using the above-defined prefix code, the header portion of the output bitstream is given by $C(L(k))$. The above-defined structure of the prefix code ensures byte-alignment. It will be understood that the foregoing prefix code definition employs exponential golomb codes. It will be appreciated that other suitable coding schemes may be used for placing indexing information in the header, including, for example, Elias codes. In yet a further example, the indexing information is placed in the prefix without encoding.

At the decoder, the prefix codes are first decoded to identify the lengths of each of the subsequences. It will be understood that by knowing the lengths of the subsequences, the decoder is able to identify the start and end of each subsequence in the payload. The decoder is then able to parse the payload field to demuliplex the payload into individual encoded subsequences. In a different example embodiment, the indexing information in the header may specify the locations of the start bit of each subsequence, although the representation of the location information is likely to end up being larger than the length information and thus require a larger number of bits in the header.

Figure 7:
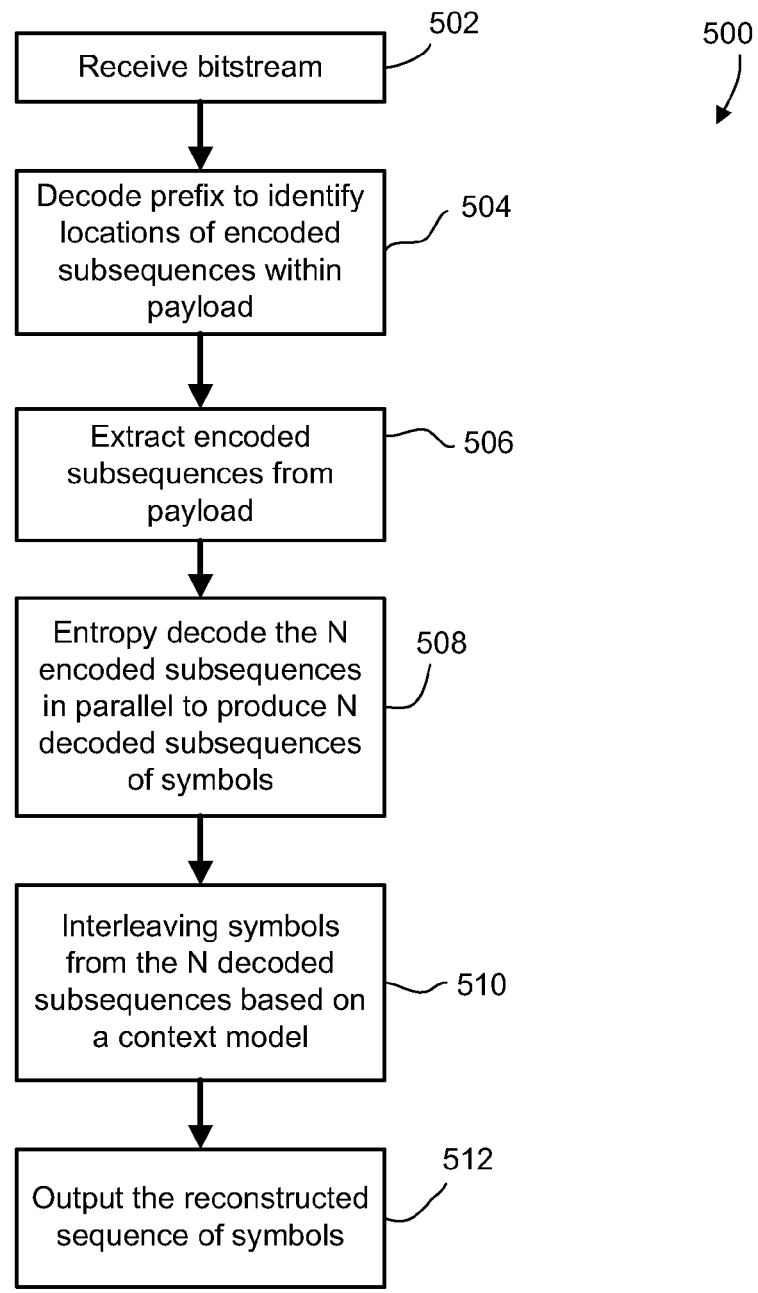
FIG. 7 shows, in flowchart form, an example method of decoding a bitstream of encoded data using parallel entropy decoders.

Reference is now made to FIG. 7, which shows, in flowchart form, a method 500 for decoding a bitstream of encoded data.

The method 500 includes receiving the bitstream of encoded data in step 502. In some instances, the bitstream may be read from a computer-readable storage medium, such as a compact disc (CD), digital video disc (DVD), Blu-ray disc, or the like. In some instances, the bitstream may be received through a communication link with one or more networks, perhaps including the Internet, over a wired or wireless connection.

In step 504, the decoder reads the prefix field of the bitstream to extract the indexing information. For example, in this embodiment, the decoder extracts the encoded length information $L(k)$ for the N encoded subsequence bitstreams. On the basis of the extracted and decoded length information, the decoder identifies the location of the N encoded subsequence bitstreams in the payload portion of the bitstream. Accordingly, in step 506, the decoder extracts the encoded subsequences from the payload field of the bitstream.

In step 508, the encoded subsequences are entropy decoded in parallel by N parallel entropy decoders. Each of the entropy decoders receives one of the encoded subsequences, entropy decodes it, and outputs a decoded subsequence of symbols.

In step 510, the N decoded subsequences are interleaved to form a reconstructed sequence of symbols. The decoded subsequences are interleaved on the basis of a context model. In particular, the decoder determines, based on the context model, an estimated probability for each bit, and on the basis of the estimated probability it selects a symbol from the decoded subsequence associated with that estimated probability.

The reconstructed sequence of symbols is then output in step 512. It will be understood that step 512 may include providing the reconstructed sequence of symbols to the remaining portions of a video or image decoder, such as the de-quantization and inverse transform processes within such a decoder.

At step 506/508, in this embodiment, the decoder is able to determine the "source" associated with each encoded subsequence bitstream within the payload field on the basis that the "sources" are placed in the field in a predetermined order. In such an example embodiment, a source having no symbols outputs a NULL code at the encoder; or the encoder ensures the prefix specifies a "zero" length encoded subsequence for that source.

In another embodiment, the order is not predetermined. In one example, the encoder specifies the order and identifies the probabilities associated with each of the encoded subsequences, for example by placing such information in the prefix field. In yet another embodiment, the probability information may be placed within the payload field as a prefix or suffix to the encoded subsequence. In yet another example embodiment, an indexing scheme may be used for communicating the order of the subsequences, without sending explicit probabilities. For example, each coder/decoder may have an index and the subsequences may each have a header portion specifying its coder/decoder index, which allows the bitstreamt to avoid the header portion altogether. Other possibilities will be appreciated by those ordinarily skilled in the art.

In some instances, the number d of parallel encoding or decoding processing units, i.e. the number of parallel entropy coders 206 (FIG. 4) or decoders 306 (FIG. 5), may differ from the number N of distinct estimated probabilities. In one case, the decoder may have fewer parallel decoders 306 than there are N probabilities. The decoder may adopt scheduling so as to have one or more decoders process multiple subsequences, thereby reducing the parallelism to a degree. However, in one case the encoder, if it knows that the decoder has d<N decoders 306, may merge some of the sources/probabilities so that the number of subsequences generated by the encoder is no greater than d.

In another scenario, if the decoder has d>N decoders 306, then the encoder may split some sources/probabilities in order to maximize the use of the available parallel decoders 306.

In yet another scenario, the encoder does not know in advance how many parallel decoders 306 are available in the decoder. In this case, if the decoder has fewer parallel decoders 306 than the subsequences generated by the encoder, then the decoder cannot process all the subsequences in parallel and the decoder may schedule use of the decoders 306 amongst the subsequences.

For those instances where the number d of parallel decoding processing units differ from N, it would be advantageous to have a mechanism for combining source outputs (for d<N), or splitting source outputs (for d>N). For this example mechanism, the encoder knows the value d at the time of encoding. Nevertheless, if the decoder does not have d decoding units, lossless decoding is still achievable.

In this example let p be the LPS probability of source k. The overhead of output sequence k is seen to be $OH(k)=8*|C(L(k))|-4*\log(1-p)+4$, where $|C(v)|$ is the number of bytes representing value v using the prefix codes described above. If there is a source m with LPS probability q, for which $OH(k)>N(k)*[p*\log(p/q)+(1-p)\log((1-p)/(1-q))]$, where $N(k)$ is the number of binary symbols in the output of source k, then we merge the output of source k with that of source m, and use LPS=q for the merged sequence. This process can be repeated as long as $OH(k)/N(k)$ is greater than the relative entropy between some sources k and m.

Context Modeling with Reordering

Those skilled in the art will appreciate from the above description of parallel coding and decoding of subsequences that the bottleneck in such an encoder or decoder may be the context modeling. In both the encoder and decoder, the context modeling process consumes bits one at a time. For example, at the encoder 200 shown in FIG. 4, the input sequence x 102 is processed by the context modeling component and demultiplexer 204 bit-by-bit. Specifically, for each successive bit in the input sequence x 102, its context is first determined based on the predetermined model implemented within the encoder 200. The probability associated with that bit is then determined based on the history of bits having the same context. In other words, with many context modeling schemes, the assessment of probability is based on the bit history specific to that context. Another bit with a different context has a different bit history.

In this manner, the context modeling component and demultiplexer 204 finds the context and then the probability for each bit in turn. It will be appreciated that the subsequences $(b_1, b_2, \ldots, b_N)$ associated with each probability may include bits that have different contexts. The decoder 300 (FIG. 5) uses the same context modeling to reassemble and interleave the decoded bits into the reconstructed sequence 310 (FIG. 5). The context modeling component and multiplexer 308 (FIG. 5) determines the context for the next bit, and based on the bit history for that context, it determines the probability associated with the next bit. From that determination of the probability the context modeling component and multiplexer 308 selects the next decoded bit associated with that probability. On this basis, it interleaves bits one-by-one to create the reconstructed sequence 310.

In accordance with one aspect of the present application, the context modeling is revised to incorporate a reordering process that permits the context modeling to occur in parallel to some degree. The input sequence is reordered into groups of bits, no group being larger than M bits, where each group can be processed by a context modeling component in parallel, i.e. the up-to-M bits are processed in parallel.

The reordering is performed at the encoder and decoder. The reordering is dependent upon the context model, and not the content of the input sequence, so the reordering schedule may be determined offline.

There are two conditions imposed on each of the groups of bits. First, each bit in a group of bits has a different context from each of the other bits in the group. In other words, the groups of bits are formed in the reordering schedule such that no group will contain two bits having the same context. This condition prevents a cyclic problem in which two bits from the same context cannot be assessed in parallel since the probabilities assigned to those two bits will depend on the bit history for that context. If there is more than one bit from the same context in the group, they cannot be assigned probabilities in parallel since at least one of them will change the bit history for the other one. Accordingly the groups of bits are formed in the reordering schedule such that no group of bits has two bits with the same context.

The second condition is that the context of each bit in a group of bits may be determined independently from the other bits in the group. In other words, the context of each bit in the group must be determinable without reference to the other bits in the group. If the context of a bit in the group depends upon the content/value of any other bit in the group, then the second condition is not met.

The reordering schedule is created offline so as to avoid violating the two conditions. In this context, offline means at any time prior to the encoding or decoding processes as opposed to during the encoding or decoding processes.

A reordering schedule can also be described as follows. For convenience, we may write the input sequence X, as X[i] and the context of each bit $c_i$ as c[i]. For the sequence $X=X_0 X_1 \ldots X_{n-}$, instead of using the natural order $0, 1, 2, 3, \ldots, n-1$, the reordering schedule intends to find a new coding order $j_0, j_1, \ldots, j_{n-1}$ such that the following conditions are satisfied: There exists an integer K, $0<=K<n/M$, such that for all $k<=K$ (1) $X[j_{kM}] X[j_{kM+1}] \ldots X[j_{(k+1)M-1}]$ all have distinct contexts $c[j_{kM}] c[j_{kM+1}] \ldots c[j_{(k+1)M-1}]$, and (2) The derivations of $c[j_{kM}], c[j_{kM+1}], \ldots,$ and $c[j_{(k+1)M-1}]$ do not depend upon $X[j_{kM}] X[j_{kM+1}] \ldots X[j_{(k+1)M-1}]$.

As such, the present application provides a method to discover the intrinsic parallelism in the given context model.

What follows is a description of at least one example method or process for developing the reordering schedule so as to comply with the two conditions for a given context model.

The process begins with a given context model, since the reordering schedule is specific to a context model. Let $X=X_0X_1 \ldots X_{n-1}$ denote the random sequence to be encoded. Suppose that we would like to process M bits simultaneously in context modelling at the decoder. The solution determines a coding order for X. Let F denote an ordered buffer of length M, let $c_i$ denote the context for X, determined by the given context model, and let z denote a length n integer sequence. The following example process may be used to generate the reordering schedule:

Step 1: Set j=0, j'=0, and initialize z so that $z_i=-1$ for all 0<=i<n.

Step 2: Set i=j, k=0, and j=n. Initialize F to be empty.

Step 3: If $z_i$>0, go to Step 5; otherwise continue to Step 4.

Step 4: If $c_j$ does not depend upon any symbols in F, do the following:
insert $X_i$ into F;
set k=k+1;
set $z_i$=j' and j'=j'+1;
If $c_j$ depends on any symbol in F, do the following
if i<j; set j=i.

Step 5: Set i=i+1;

Step 6: Repeat Steps 3-5 until k=M or i=n.

Step 7: if k=M and j<n, empty F, and go to Step 2; otherwise continue to Step 8.

Step 8: Set i=j;

Step 9: If $z_i$>0, go to Step 11; otherwise continue to Step 10.

Step 10: Set $z_i$=j' and j'=j'+1;

Step 11: set i=i+1;

Step 12: Repeat Steps 9-11 until j'=n.

It will be appreciated that the foregoing process is one example embodiment of a process for realizing a reordering schedule for a given context model that satisfies the two conditions set out above for enabling parallel context modeling.

It will be appreciated that the process described above can be refined so that the coding order can be partitioned into consecutive segments with various parallelism. For example, the first segment allows for processing M bits in parallel, the second segment allows for processing M−1 bits in parallel, and so on.

In one example implementation, the process may begin with a maximum desired number of bits M for the groups of bits. The sequence X with the given context model may be analyzed to find all possible groups of length M that meet the two conditions. The group of bits length may then be shortened until all bits of the sequence X are a member of a group, and the groups may have lengths that vary from 1 to M. An example process may be as follows:

Step 1: Set M=16.

Step 2: Form all possible groups of bits of length M from the bits of the input sequence, where the groups each meet the two conditions.

Step 3: Set M=M−1.

Step 4: Repeat Steps 2 and 3 until M=0.

Further, since the reordering schedule is determined offline, one can also use exhaustive search to find the best reordering for a given context model in terms of throughput in parallel processing.

Even further, in the case where there are several competing context models, the present reordering process or its variations may be used to find the reordering schedule that has better throughput than others in parallel processing.

It should be pointed out that the process described herein or its variations may be used to improve error resiliency.

It will also be noted that here the concept of context is general, including coding decisions. For example, in CABAC of the H.264 AVC standard, a last bin decision signifying whether the current position is the last significant position is encoded only when the significant bit at the same position is set. Thus, although the context model specified in the H.264 AVC standard does not reference the significant bit, in the above solution the context model is extended so that such dependency is reflected in the reordering schedule.

Figure 10:
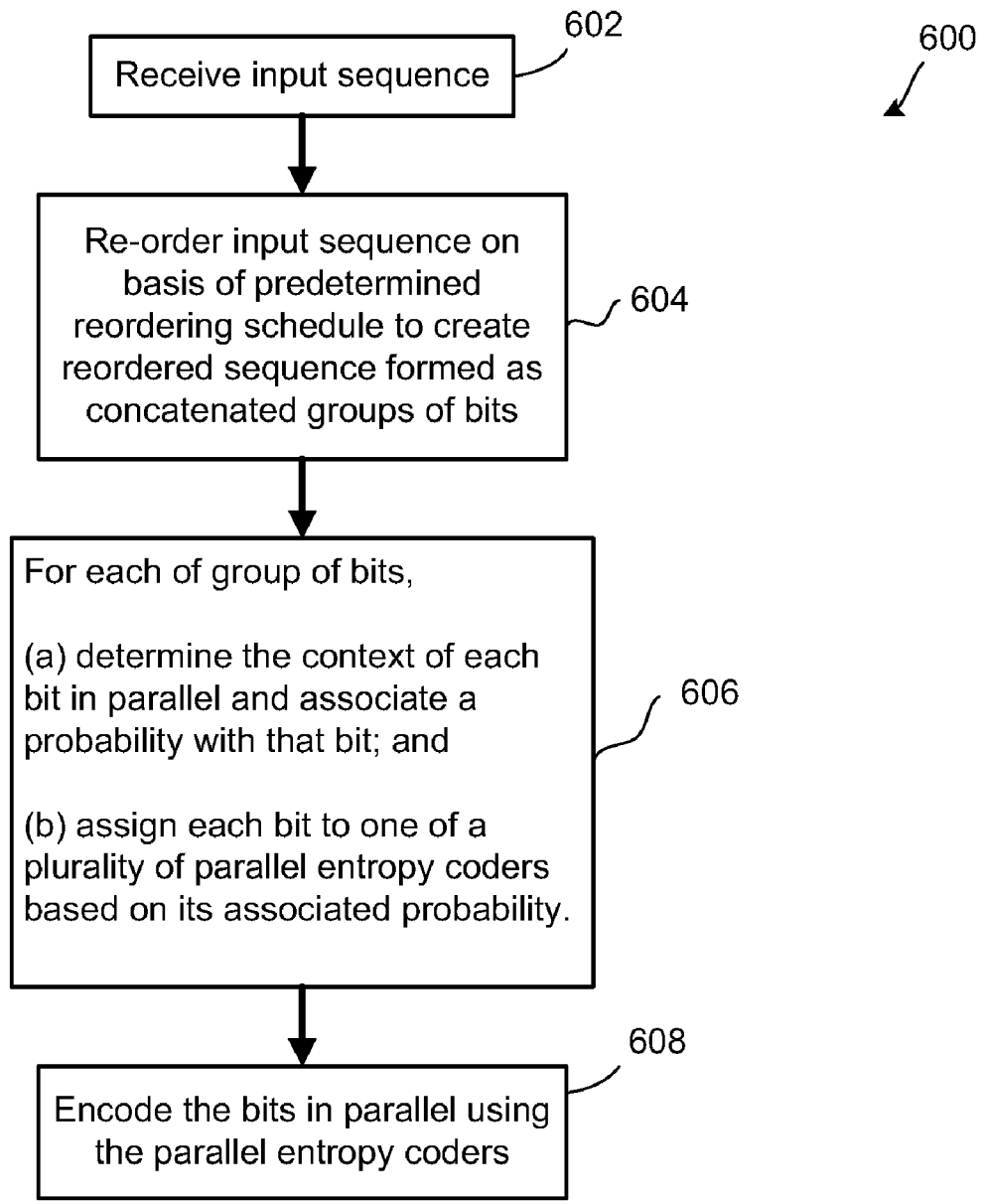
FIG. 10 shows, in flowchart form, a method for reordered parallel encoding of an input sequence.

Reference is now made to FIG. 10, which shows, in flowchart form, an example method 600 for reordered entropy coding. In this example embodiment, the encoder is configured to perform parallel entropy coding, although the present application is not restricted to parallel entropy coding. The method 600 begins with receipt of the input sequence in step 602. The input sequence is a sequence of symbols belonging to a finite alphabet; in this example embodiment, the sequence is binary.

The sequence is reordered in step 604 to form a reordered sequence. The reordering is based on a reordering schedule that meets the two conditions set out above for a given context model. As discussed above, the reordering schedule is predetermined for the given context model. The reordered sequence, so formed, is composed of concatenated groups of bits that meet the two conditions.

Each group of bits is then processed in parallel so as to assign the bits to the appropriate entropy coder. Specifically, as noted in step 606, for each group of bits, the context of each bit is determined in parallel. Each bit is then associated with a probability based on its context and the bit history for that context. The determination of context and association with a probability occurs in parallel for the bits in the group. Each of the bits is then assigned to the appropriate entropy coder based on its associated probability.

In step 608, the parallel entropy coders encode the bits in parallel to produce a bitstream of encoded data as described earlier.

The example process in FIG. 10 presumes parallel entropy coding. It will be understood that the reordered context modeling described herein does not necessarily involve parallel entropy coding. Reordered context modeling improves the throughput of the context modeling aspect of the encoding process; the entropy coding of inputs bits using that context information may be parallel or serial. For example, the reordered context modeling can be used with CABAC in H.264.

The description of an example decoding process below also presumes the use of parallel entropy decoders. It will be understood that the present application is not limited to parallel entropy decoding. The reordered context modeling described below can be used with parallel or serial entropy decoding.

Figure 11:
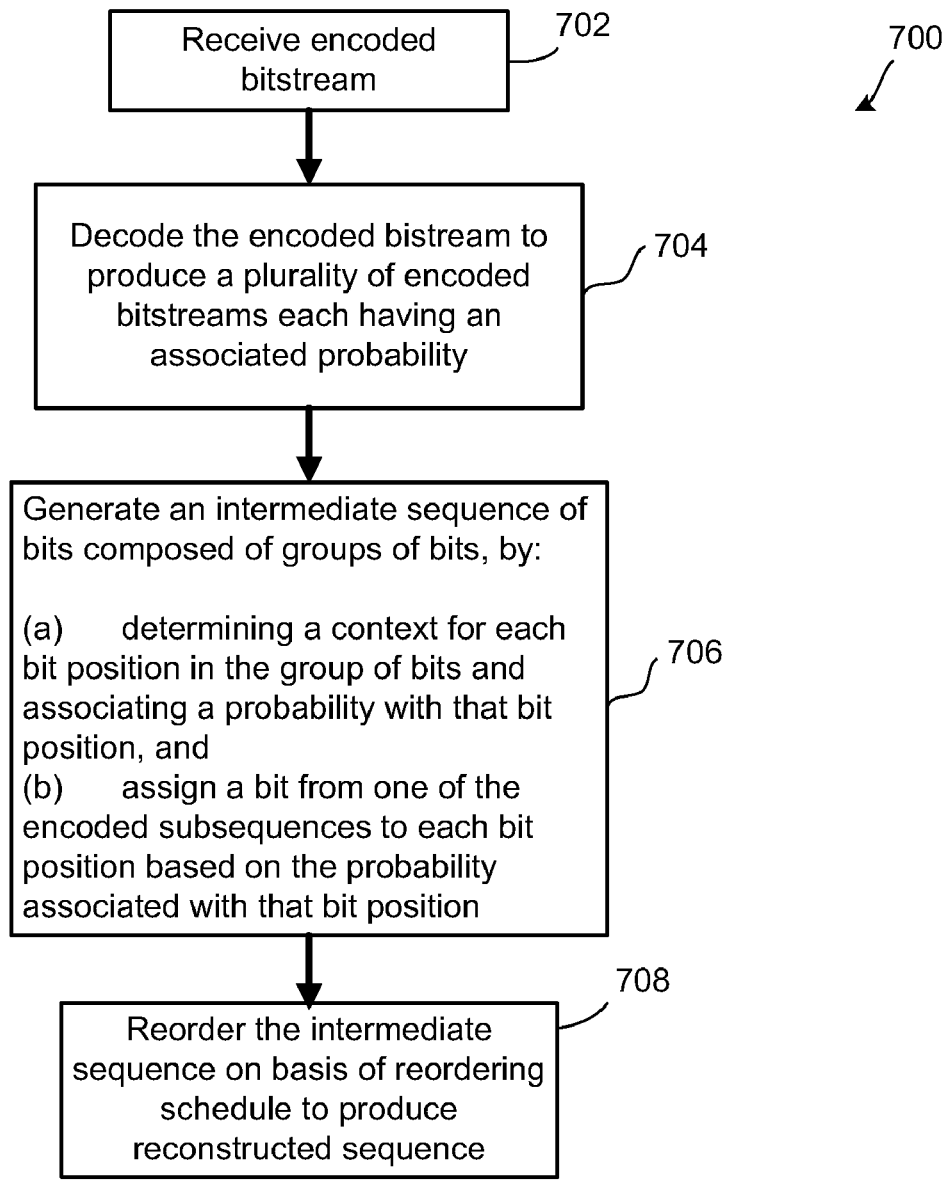
FIG. 11 shows, in flowchart form, a method for reordered parallel decoding of an encoded bitstream.

Reference is now made to FIG. 11, which shows, in flowchart form, an example method 700 for decoding an encoded bitstream using reordered context modeling. The method 700 begins with receipt of the encoded bitstream in step 702. As described above, the encoded bitstream may be entropy decoded to produce a plurality of decoded subsequences each associated with a particular probability, as indicated in step 704. In the present embodiment, the decoding may occur using a number of parallel entropy decoders to produce the plurality of decoded subsequences. In another embodiment, the decoder may use a serial entropy decoder to produce a single decoded sequence.

In step 706, an intermediate sequence is generated using context modeling to assign bits from the decoded subsequences to the intermediate sequence, thereby interleaving them to recreate or reconstruct the "reordered" input sequence. In other words, the intermediate sequence is the plurality of concatenated groups of bits. To reconstruct the groups of bits, step 706 involves determining the context for each bit in the next group of bits, i.e. the context for each bit position in the group of bits. Using that context and the bits history associated with that context, the probability associated with that bit position is then determined. It will be understood that the determination of the context of each bit position in the group and the association of a probability with that bit position is performed in parallel for the bits in a group. On the basis of the associated probabilities for the bit positions, bits from the decoded subsequences are then assigned to those positions to form and output the group of bits. The next group of bits is then generated in a similar manner.

The intermediate sequence so formed, is then reordered in step 708 on the basis of the same reordering schedule used at the encoder. The reordering schedule describes how the groups of bits are to be reordered to form the reconstructed sequence. The reconstructed sequence is then available for the remainder of the decoding process, such as dequantization, inverse transformation, motion or spatial compensation, etc.

It will be understood that an intermediate sequence is not necessarily formed in the case of serial entropy decoding. A method for decoding may include decoding the bitstream to produce decoded groups of bits. For each group the decoding to produce that group of bits is based upon a context modeling process. The context modeling process may exploit the available parallelism in the reordered groups of bits if they have been so encoded. Accordingly, for each group of bits the decoder determines a context and associates a probability with that bit based on its context. It may do so in parallel for all bits in the group of bits provided the two conditions outlined above are met by the group of bits. That is, the context of each of the bits in that group of bits is different from the context of each of the other bits in that group, and the context of each of the bits in that group is determined independently from each of the other bits in that group. The reordering schedule that was developed offline for the particular context model and that used in the encoding process is known to the decoder. The decoder is thus able to reorder the decoded bits of the groups of bits based on the reordering schedule to return the bits to their natural order and thus produce the reconstructed sequence of bits.

Figure 8:
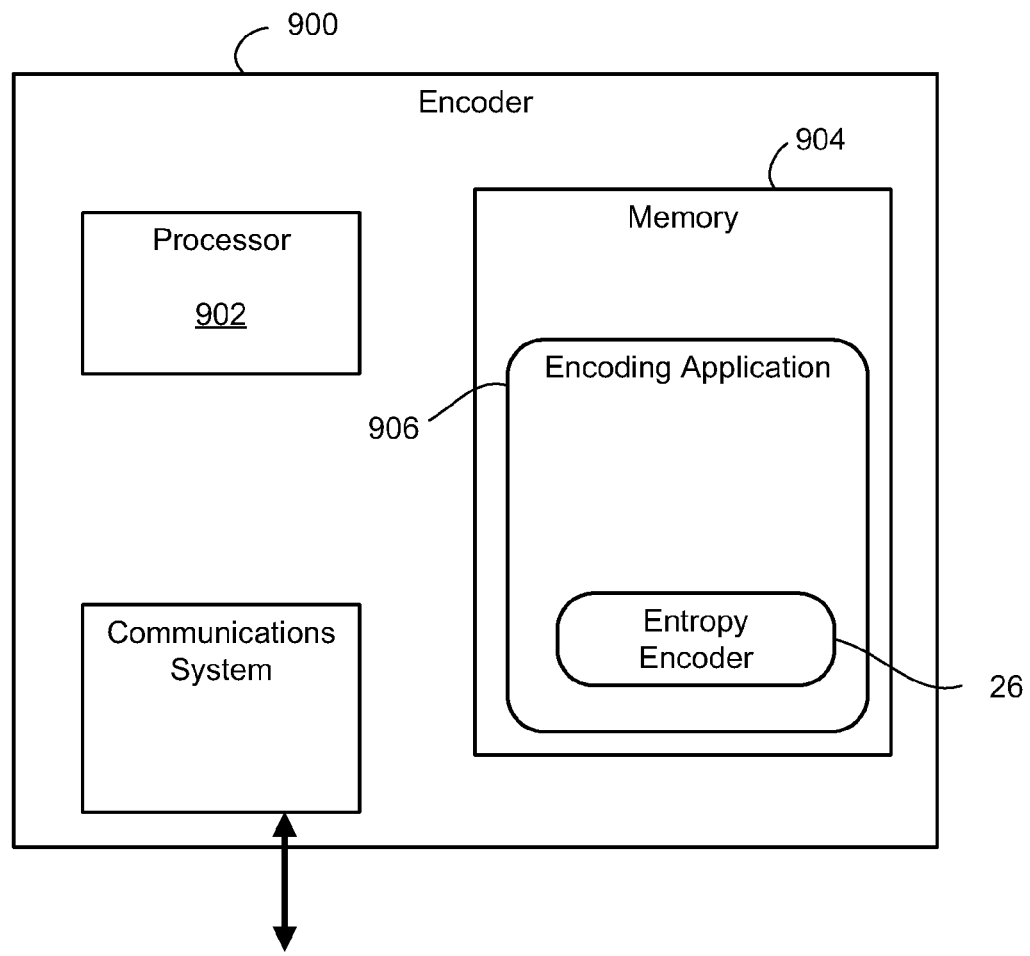
FIG. 8 shows a simplified block diagram of an example embodiment of an encoder.

Reference now made to FIG. 8, which shows a simplified block diagram of an example embodiment of an encoder 900. The encoder 900 includes a processor 902, memory 904, and an encoding application 906. The encoding application 906 may include a computer program or application stored in memory 904 and containing instructions for configuring the processor 902 to perform steps or operations such as those described herein. For example, the encoding application 906 may encode and output video bitstreams encoded in accordance with the parallel entropy encoding process described herein. The encoding application 906 may include an entropy encoder 26 configured to entropy encode input sequences and output a bitstream using one or more of the processes described herein. It will be understood that the encoding application 906 may be stored in on a computer readable medium, such as a compact disc, flash memory device, random access memory, hard drive, etc.

In some embodiments, the processor 902 in the encoder 900 may be a single processing unit configured to implement the instructions of the encoding application 906. In some other embodiments, the processor 902 may include more than one processing unit capable of executing instructions in parallel. The multiple processing units may be logically or physically separate processing units. In some instances, the encoder 900 may include N or more processing units, wherein N of the processing units are configured by the encoding application 906 to implement the methods described herein. It will further be appreciated that in some instances, some or all operations of the encoding application 906 and one or more processing units may be implemented by way of application-specific integrated circuit (ASIC), etc.

Figure 9:
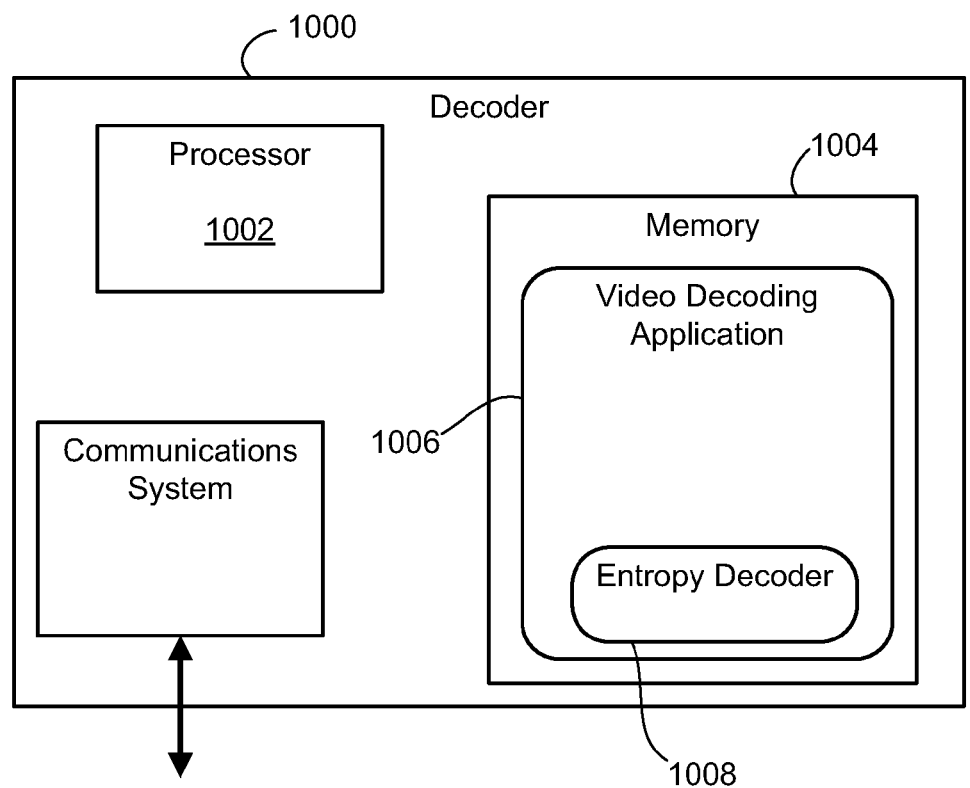
FIG. 9 shows a simplified block diagram of an example embodiment of a decoder.

Reference is now also made to FIG. 9, which shows a simplified block diagram of an example embodiment of a decoder 1000. The decoder 1000 includes a processor 1002, a memory 1004, and a decoding application 1006. The decoding application 1006 may include a computer program or application stored in memory 1004 and containing instructions for configuring the processor 1002 to perform steps or operations such as those described herein. The decoding application 1006 may include an entropy decoder 1008 configured to receive a bitstream encoded in accordance with the entropy encoding process described herein, and to extract encoded data from the bitstream. In some embodiments, the decoding application 1006 may configure the processor to decode the encoded subsequences in parallel to produce parallel decode sequences and to interleave the symbols of the decode sequences to produce a reconstructed sequences, as described herein. It will be understood that the decoding application 1006 may be stored in on a computer readable medium, such as a compact disc, flash memory device, random access memory, hard drive, etc.

In some embodiments, the processor 1002 in the decoder 1000 may be a single processing unit configured to implement the instructions of the decoding application 1006. In some other embodiments, the processor 1002 may include more than one processing unit capable of executing instructions in parallel. The multiple processing units may be logically or physically separate processing units. In some instances, the decoder 1000 may include d, N or more or fewer processing units, wherein the processing units are configured by the decoding application 1006 to operate as parallel entropy decoders for implementing the methods described herein. It will further be appreciated that in some instances, some or all operations of the decoding application 1006 and one or more processing units may be implemented by way of application-specific integrated circuit (ASIC), etc.

It will be appreciated that the decoder and/or encoder according to the present application may be implemented in a number of computing devices, including, without limitation, servers, suitably programmed general purpose computers, set-top television boxes, television broadcast equipment, and mobile devices. The decoder or encoder may be implemented by way of software containing instructions for configuring a processor to carry out the functions described herein. The software instructions may be stored on any suitable computer-readable memory, including CDs, RAM, ROM, Flash memory, etc.

It will be understood that the encoder and decoder described herein and the module, routine, process, thread, or other software component implementing the described method/process for configuring the encoder may be realized using standard computer programming techniques and languages. The present application is not limited to particular processors, computer languages, computer programming conventions, data structures, other such implementation details. Those skilled in the art will recognize that the described processes may be implemented as a part of computer-executable code stored in volatile or non-volatile memory, as part of an application-specific integrated chip (ASIC), etc.

Certain adaptations and modifications of the described embodiments can be made. Therefore, the above discussed embodiments are considered to be illustrative and not restrictive.

What is claimed is:

1. A method for encoding of an input sequence of bits, the method comprising:
   reordering, with a processor, the input sequence into groups of input bits in accordance with a predetermined reordering schedule;
   for each group of input bits,
      determining, with the processor, in parallel, a context for each of the input bits in the group of input bits and associating a probability with that bit based on its context,
         wherein the context for each of the input bits in the group is different from the context of each of the other input bits in the group, and the context of each of the input bits in the group is determined independently from the other input bits in the group; and
      entropy encoding, with the processor, the input bits to generate an encoded subsequence.

2. The method claimed in claim 1, wherein the predetermined reordering schedule defines the groups of input bits into which the bits of the input sequence are allocated in the reordering.

3. The method claimed in claim 2, wherein the predetermined reordering schedule is determined offline and is based upon a predefined context model.

4. The method claimed in claim 3, further comprising defining the predetermined reordering schedule.

5. The method claimed in claim 1, wherein determining further includes assigning each bit in the group of input bits to one of a plurality of parallel entropy coders based on its associated probability.

6. An encoder for encoding an input sequence of symbols, the symbols belonging to a finite alphabet, the encoder comprising:
   a processor;
   a memory; and
   an encoding application stored in memory and containing instructions for configuring the processor to
      reorder the input sequence into groups of input bits in accordance with a predetermined reordering schedule;
      for each group of input bits,
         determine, in parallel, a context for each of the input bits in the group of input bits and associating a probability with that bit based on its context,
            wherein the context for each of the input bits in the group is different from the context of each of the other input bits in the group, and the context of each of the input bits in the group is determined independently from the other input bits in the group; and
         entropy encode the input bits to generate an encoded subsequence.

7. The encoder claimed in claim 6, wherein the predetermined reordering schedule defines the groups of input bits into which the bits of the input sequence are allocated in the reordering.

8. The encoder claimed in claim 7, wherein the predetermined reordering schedule is determined offline and is based upon a predefined context model, and wherein the memory stores the reordering schedule.

9. The encoder claimed in claim 6, wherein the encoder includes a plurality of parallel entropy coders, and wherein the processor is configured to assign each bit in the group of input bits to one of the parallel entropy coders based on its associated probability.

10. A method for decoding a bitstream of encoded data to reconstruct a sequence of bits, the method comprising:
    decoding, with a processor, the bitstream of encoded data to produce decoded groups of bits, wherein, for each group of bits, the decoding to produce that group of bits includes determining a context for each bit in that group of bits and associating a probability with that bit based on its context, and wherein the context for each of the bits in that group of bits is different from the context of each of the other bits in that group, and the context of each of the bits in that group is determined independently from each of the other bits in that group; and
    reordering, with the processor, the bits of the groups of bits based on a predetermined reordering schedule to produce the reconstructed sequence of bits.

11. The method claimed in claim 10, wherein the predetermined reordering schedule defines the groups of bits and the manner in which the bits in the groups of bits are reordered to produce the reconstructed sequence of bits.

12. The method claimed in claim 11, wherein the predetermined reordering schedule is determined offline and is based upon a predefined context model.

13. The method claimed in claim 12, further comprising defining the predetermined reordering schedule.

14. A decoder for decoding encoded data for decoding a bitstream of encoded data to reconstruct a sequence of symbols, the symbols belonging to a finite alphabet, the decoder comprising:
    a processor;
    a memory; and
    a decoding application stored in memory and containing instructions for configuring the processor to
       decode the bitstream of encoded data to produce decoded groups of bits, wherein, for each group of bits, the decoding to produce that group of bits includes determining a context for each bit in that group of bits and associating a probability with that bit based on its context, and wherein the context for each of the bits in that group of bits is different from the context of each of the other bits in that group, and the context of each of the bits in that group is determined independently from each of the other bits in that group; and
       reorder the bits of the groups of bits based on a predetermined reordering schedule to produce the reconstructed sequence of bits.

15. The decoder claimed in claim 14, wherein the predetermined reordering schedule defines the groups of bits and the manner in which the bits in the groups of bits are reordered to produce the reconstructed sequence of bits.

16. The decoder claimed in claim 15, wherein the predetermined reordering schedule is determined offline and is based upon a predefined context model, and wherein the memory stores the reordering schedule.

17. A non-transitory computer readable medium storing computer-executable instructions for configuring a processor to perform the method claimed in claim 1.

18. A non-transitory computer readable medium storing computer-executable instructions for configuring a processor to perform the method claimed in claim 10.

* * * * *